(12) United States Patent
Shinn et al.

(10) Patent No.: US 8,115,886 B2
(45) Date of Patent: Feb. 14, 2012

(54) FLEXIBLE DISPLAY APPARATUS

(75) Inventors: Ted-Hong Shinn, Hsinchu (TW);
Yu-Sheng Lin, Hsinchu (TW);
Yuan-Chih Tsai, Hsinchu (TW);
Chi-Ming Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 38 days.

(21) Appl. No.: 12/180,357

(22) Filed: Jul. 25, 2008

(65) Prior Publication Data

US 2009/0256991 A1   Oct. 15, 2009

(30) Foreign Application Priority Data

Apr. 11, 2008   (TW) ................................ 97113375 A

(51) Int. Cl.
*G02F 1/1333* (2006.01)
(52) U.S. Cl. .......................................................... 349/58
(58) Field of Classification Search ................... 349/58, 349/60
See application file for complete search history.

(56) References Cited

U.S. PATENT DOCUMENTS

| | | | | |
|---|---|---|---|---|
| 4,261,042 A * | 4/1981 | Ishiwatari et al. | ............ | 708/138 |
| 4,723,195 A * | 2/1988 | Mizzi et al. | .................... | 361/729 |
| 5,612,804 A * | 3/1997 | Hara | ............................. | 349/149 |
| 5,943,214 A * | 8/1999 | Sato et al. | ..................... | 361/752 |
| 7,322,863 B2 * | 1/2008 | Rapp | ........................ | 439/620.01 |
| 7,359,215 B2 * | 4/2008 | Ochiai et al. | .................. | 361/789 |
| 2005/0062902 A1 * | 3/2005 | Fukayama | ..................... | 349/58 |
| 2006/0203140 A1 * | 9/2006 | Kim | .............................. | 349/58 |
| 2007/0242183 A1 * | 10/2007 | Fukayama | ..................... | 349/58 |
| 2008/0158469 A1 * | 7/2008 | Lee | ................................ | 349/58 |
| 2008/0218661 A1 * | 9/2008 | Tsai et al. | ....................... | 349/65 |
| 2008/0237356 A1 * | 10/2008 | Singleton et al. | ............. | 235/492 |
| 2009/0297873 A1 * | 12/2009 | Yum et al. | ..................... | 428/596 |

FOREIGN PATENT DOCUMENTS

| | | |
|---|---|---|
| CN | 1553255 A | 12/2004 |
| CN | 101149495 A | 3/2008 |
| TW | 1286629 | 9/2007 |
| TW | 2008/15882 A | 4/2008 |

OTHER PUBLICATIONS

Office Action From China Patent Office.

* cited by examiner

*Primary Examiner* — Eric Wong
(74) *Attorney, Agent, or Firm* — Chun-Ming Shih

(57) ABSTRACT

A flexible display apparatus includes a flexible display panel and a flexible printed circuit board (FPCB). The flexible display panel includes a display body and a peripheral circuit. The peripheral circuit is adjacent to the display body, and the FPCB is connected to the peripheral circuit. The FPCB includes a first portion and a second portion, wherein the first portion is connected between the peripheral circuit and the second portion. Bending modulus of the first portion is lower than that of the second portion. The flexible display apparatus has better reliability. Another flexible display apparatus is also provided.

6 Claims, 4 Drawing Sheets

FLEXIBLE DISPLAY APPARATUS

BACKGROUND

1. Field of the Invention

The present invention generally relates to a display apparatus, and more particularly to a flexible display apparatus.

2. Description of the Prior Art

With the progress of the flat panel display technique, more and more electrical products, especially portable electrical products, such as mobile phones, e-books, digital cameras, personal digital assistants (PDA), etc., are respectively equipped with a display apparatus.

The development trend of the portable electrical product is achieving light weight and thin thickness, so the display apparatus for the portable electrical product should have features of light weight and thin thickness.

The flexible display apparatus, such as the flexible electrophoretic display (EPD) and the flexible liquid crystal display (LCD) etc., not only has features of light weight and thin thickness, but also has features of flexibility and hard to be broken. Therefore, the development of the flexible display apparatus has become increasingly important.

FIG. 1 is a schematic view of a conventional flexible display apparatus. Referring to FIG. 1, the conventional flexible display apparatus 100 includes a flexible display panel 110 and a flexible printed circuit board (FPCB) 120. The flexible display panel 110 includes a display body 112 and a peripheral circuit 114. The peripheral circuit 114 is adjacent to the display body 112, and the FPCB 120 is connected to the peripheral circuit 114. The FPCB 120 has a connection interface 122 for connecting to an outside circuit (not shown), and the display body 112 is connected to the outside circuit via the peripheral circuit 114 and the FPCB 120.

In the conventional technique, the FPCB 120 may be pulled or flexed when connecting the FPCB 120 with the outside circuit. This easily causes different kinds of damages (e.g. electrical damage and structure damage) between the FPCB 120 and the peripheral circuit 114, and reliability of the flexible display apparatus 100 is therefore reduced.

BRIEF SUMMARY

The present invention provides a flexible display apparatus having better reliability.

The present invention further provides a flexible display apparatus to improve reliability.

In order to achieve the above-mentioned advantages, a flexible display apparatus is provided. The flexible display apparatus comprises a flexible display panel and a flexible printed circuit board (FPCB). The flexible display panel comprises a display body and a peripheral circuit. The peripheral circuit is adjacent to the display body, and the FPCB is connected to the peripheral circuit. The FPCB comprises a first portion and a second portion, wherein the first portion is connected between the peripheral circuit and the second portion. Bending modulus of the first portion is smaller than that of the second portion.

In an embodiment of the present invention, a thickness of the first portion is smaller than that of the second portion.

In an embodiment of the present invention, the thickness of the first portion is between 0.03 mm and 0.1 mm, and the thickness of the second portion is between 0.1 mm and 0.15 mm.

In an embodiment of the present invention, the first portion has two short sides connected between the second portion and the peripheral circuit, wherein a length of each of the short sides is greater than 5 millimeters.

In an embodiment of the present invention, the flexible display apparatus further comprises a frame assembly. The frame assembly comprises a first frame and a second frame, wherein the first frame is for carrying the flexible display panel, and the second frame is assembled with the first frame to cover the peripheral circuit and expose the display body.

In an embodiment of the present invention, the FPCB has a locating hole, and the frame assembly has a locating unit for passing through the locating hole.

In an embodiment of the present invention, the locating unit comprises a fixed pin and a fixed hole, the fixed pin is for passing through the locating hole and fixed in the fixed hole. One of the fixed pin and the fixed hole is disposed at the first frame, and the other one of the fixed pin and the fixed hole is disposed at the second frame.

In an embodiment of the present invention, the locating hole is disposed at the first portion.

In an embodiment of the present invention, the flexible display panel comprises a flexible electrophoretic display panel or a flexible liquid crystal display panel.

In order to achieve the above-mentioned advantages, another flexible display apparatus is provided. The flexible display apparatus comprises a flexible display panel, an FPCB and a frame assembly. The flexible display panel comprises a display body and a peripheral circuit, wherein the peripheral circuit is adjacent to the display body. The FPCB is connected to the peripheral circuit and has a locating hole. The frame assembly comprises a first frame and a second frame. The first frame is for carrying the flexible display panel, and the second frame is assembled with the first frame to cover the peripheral circuit and expose the display body. Moreover, the frame assembly has a locating unit for passing through the locating hole.

In an embodiment of the present invention, the locating unit comprises a fixed pin and a fixed hole. The fixed pin is for passing through the locating hole and fixed in the fixed hole. One of the fixed pin and the fixed hole is disposed at the first frame, and the other one of the fixed pin and the fixed hole is disposed at the second frame.

In an embodiment of the present invention, the flexible display panel comprises a flexible electrophoretic display panel or a flexible liquid crystal display panel In the first type of the flexible display apparatus of the present invention, because the bending modulus of the first portion is smaller, influence of the FPCB on the flexible display panel can be separated when the FPCB and the flexible display panel are pulled with each other. Therefore, damages between the FPCB and the flexible display panel can be prevented. Moreover, in the second type of the flexible display apparatus of the present invention, the FPCB has the locating hole and the frame assembly has the locating unit passing through the locating hole that prevent the FPCB and the flexible display panel from being pulled with each other. Therefore, the two kinds of the flexible display apparatuses of the present invention have better reliability.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
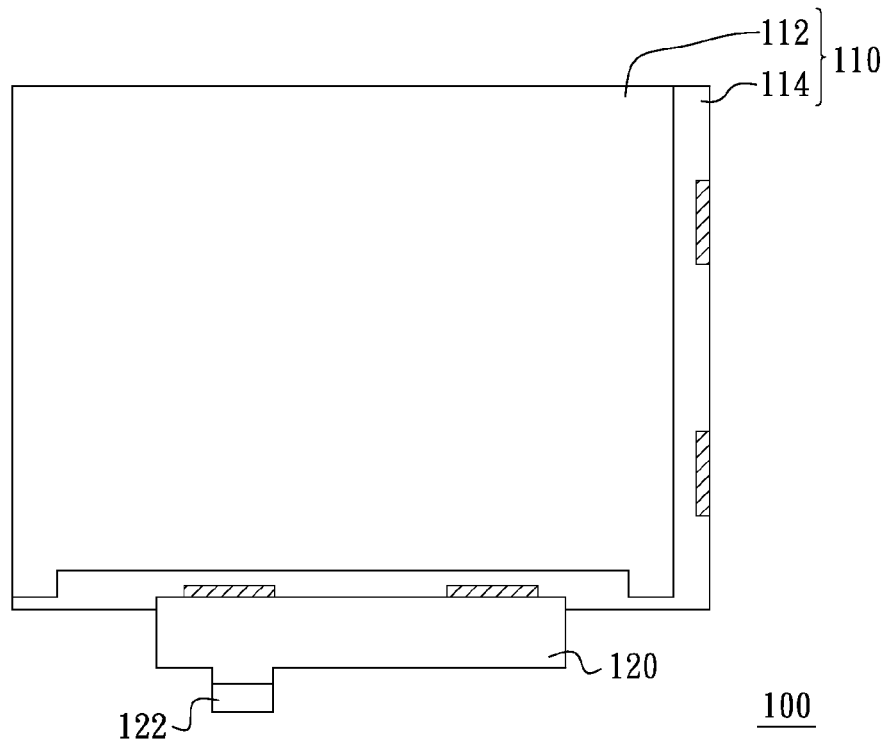
FIG. 1 is a schematic view of a conventional flexible display apparatus.
Figure 2:
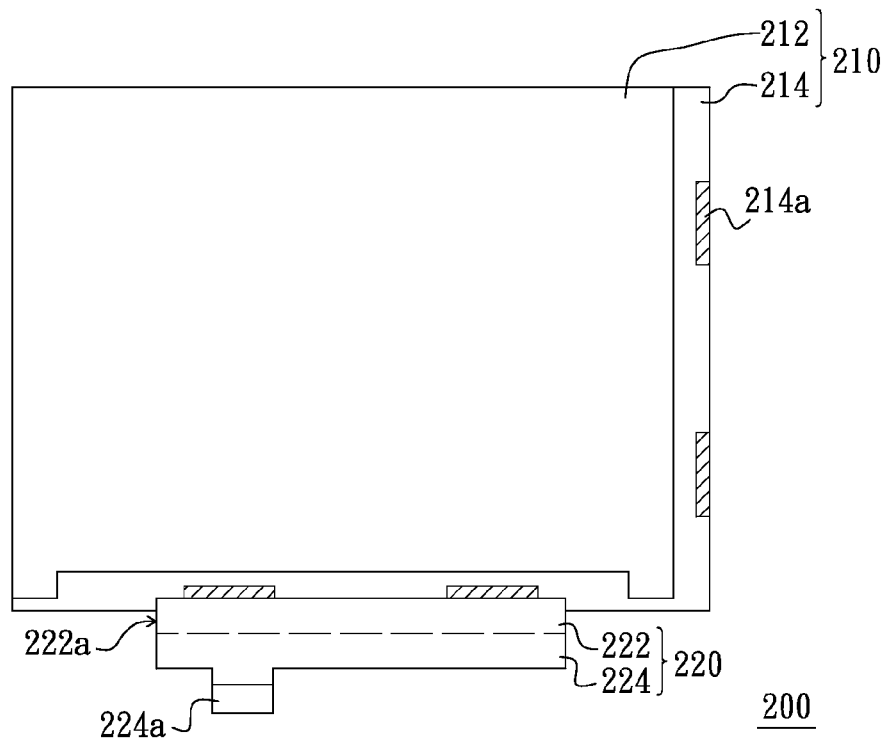
FIG. 2 is a schematic view of a flexible display apparatus according to an embodiment of the present invention.

FIG. 2 is a schematic view of a flexible display apparatus according to an embodiment of the present invention. Referring to FIG. 2, the flexible display apparatus 200 of the present embodiment comprises a flexible display panel 210 and a flexible printed circuit board (FPCB) 220. The flexible display panel 210 comprises a display body 212 and a peripheral circuit 214. The peripheral circuit 214 is adjacent to the display body 212, and the FPCB 220 is connected to the peripheral circuit 214. The FPCB 220 comprises a first portion 222 and a second portion 224, wherein the first portion 222 is connected between the peripheral circuit 214 and the second portion 224. Bending modulus of the first portion 222 is smaller than that of the second portion 224.

In the flexible display apparatus 200, the flexible display panel 210 can be, but not limited to, a flexible electrophoretic display panel or a flexible liquid crystal display panel. The peripheral circuit 214 can comprise a plurality of electrical elements 214a, such as driver integrated circuit, etc. Furthermore, the second portion 224 of the FPCB 220 has a connection interface 224a, and the connection interface 224a is for connecting to an outside circuit (not shown). The display body 212 is electrically connected to the outside circuit via the peripheral circuit 214 and the FPCB 220.

The FPCB 220 of the present embodiment comprises the first portion 222 and the second portion 224, wherein the bending modulus of the first portion 222 is smaller than that of the second portion 224. When connecting the FPCB 220 with the outside circuit, the second portion 224 of the FPCB 220 may be pulled or flexed and then the FPCB 220 and the peripheral circuit 214 may be pulled with each other. However, because of the bending modulus of the first portion 222 of the FPCB 220 being smaller, bending strain of the first portion 222 is greater than that of the second portion 224. Therefore, the first portion 222 can be used to be a stress buffer to reduce the pull force between the FPCB 220 and the peripheral circuit 214. Thus, damages (e.g. electrical damage and structure damage) between the FPCB 220 and the peripheral circuit 214 caused by pulling the FPCB 220 and the peripheral circuit 214 can be prevented, and reliability of the flexible display apparatus 200 is therefore improved.

Moreover, the first portion 222 of the FPCB 220 has two short sides 222a connected between the second portion 224 and the peripheral circuit 214. To let the first portion 222 of the FPCB 220 be sufficiently used to be the stress buffer, a length of each of the short sides 222a may be greater than 5 millimeters.

Figure 3:
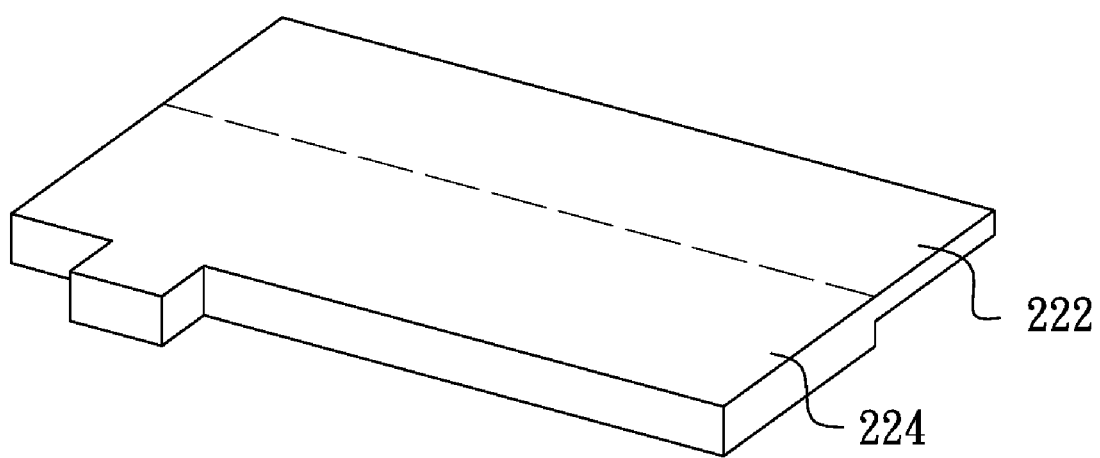
FIG. 3 is a schematic three-dimensional view of an FPCB according to an embodiment of the present invention.

In the present embodiment, a difference of material or structure between the first portion 222 and the second portion 224 may result in the bending modulus of the first portion 222 and the second portion 224 being different. The difference of structure between the first portion 222 and the second portion 224 will be detailed described below. FIG. 3 is a schematic three-dimensional view of an FPCB according to an embodiment of the present invention. Referring to FIG. 3, a thickness of the first portion 222 of the FPCB 220 is different from a thickness of the second portion 224 of the FPCB 220. More specifically, the thickness of the first portion 222 is smaller than that of the second portion 224, and therefore the bending modulus of the first portion 222 is smaller than that of the second portion 224. In an embodiment, the thickness of the first portion 222 is, for example, between 0.03 mm and 0.1 mm, and the thickness of the second portion 224 is, for example, between 0.1 mm and 0.15 mm.

Figure 4A:
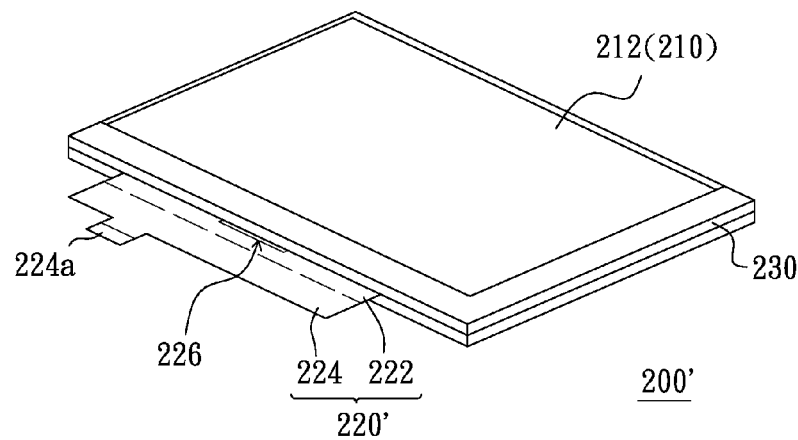
FIG. 4A is a schematic view of a flexible display apparatus according to another embodiment of the present invention.
Figure 4B:
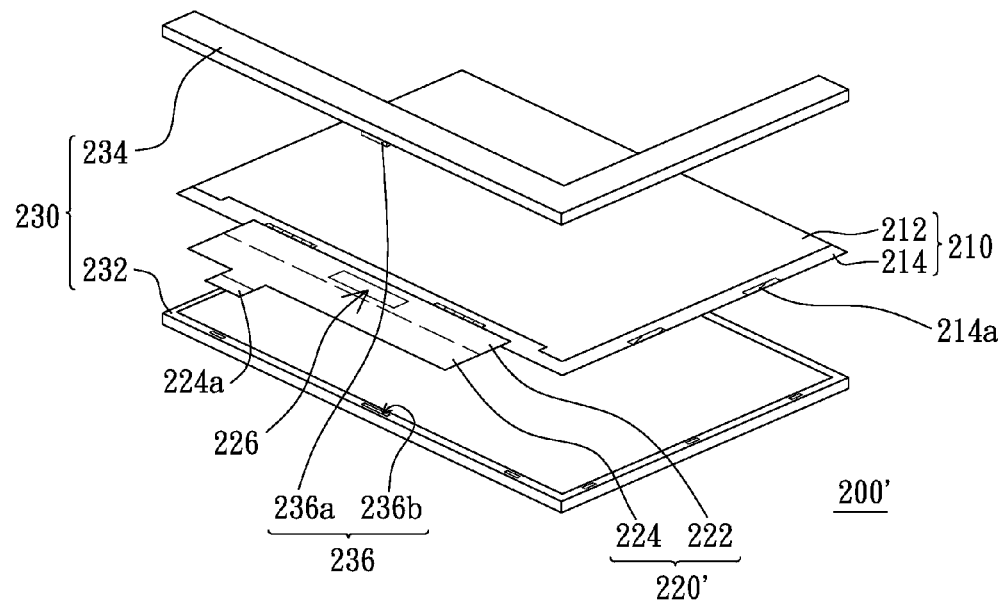
FIG. 4B is an exploded perspective view of FIG. 4A.

FIG. 4A is a schematic view of a flexible display apparatus according to another embodiment of the present invention, and FIG. 4B is an exploded perspective view of FIG. 4A. Referring to FIGS. 4A and 4B, comparing with the flexible display apparatus 200 of FIG. 2, the flexible display apparatus 200' of the present embodiment further comprises a frame assembly 230. The frame assembly 230 comprises a first frame 232 and a second frame 234. The first frame 232 is for carrying the flexible display panel 210, and the second frame 234 is assembled with the first frame 232 to cover the peripheral circuit 214 and expose the display body 212.

Furthermore, comparing with the FPCB 220 of the flexible display apparatus 200 of FIG. 2, the FPCB 220' of the flexible display apparatus 200' of the present embodiment further has a locating hole 226. The locating hole 226 is, for example, disposed at the first portion 222 of the FPCB 220. The frame assembly 230 has a locating unit 236 for passing through the locating hole 226. More specifically, the locating unit 236 comprises a fixed pin 236a and a fixed hole 236b, wherein the fixed pin 236a is disposed at the second frame 234 and the fixed hole 236b is disposed at the first frame 232. The fixed pin 236a is for passing through the locating hole 226 and fixed in the fixed hole 236b.

In the present embodiment, because the locating unit 236 of the frame assembly 230 is passing through the locating hole 226 of the FPCB 220', the locating unit 236 can prevent a connection portion between the FPCB 220' and the peripheral circuit 214 of the flexible display panel 210 from being pulled when the FPCB 220' being pulled or flexed. Therefore, damages (e.g. electrical damage and structure damage) between the FPCB 220' and the peripheral circuit 214 caused by pulling the FPCB 220' and the peripheral circuit 214 can be effectively prevented, and the reliability of the flexible display apparatus 200' of the present embodiment can be further improved.

It should be noted that although in FIG. 4, the fixed pin 236a is disposed at the second frame 234 and the fixed hole 236b is disposed at the first frame 232, positions of the fixed pin 236a and the fixed hole 236b can be exchanged. In other words, the fixed pin 236a can be disposed at the first frame 232 and the fixed hole 236b can be disposed at the second frame 234.

Figure 5A:
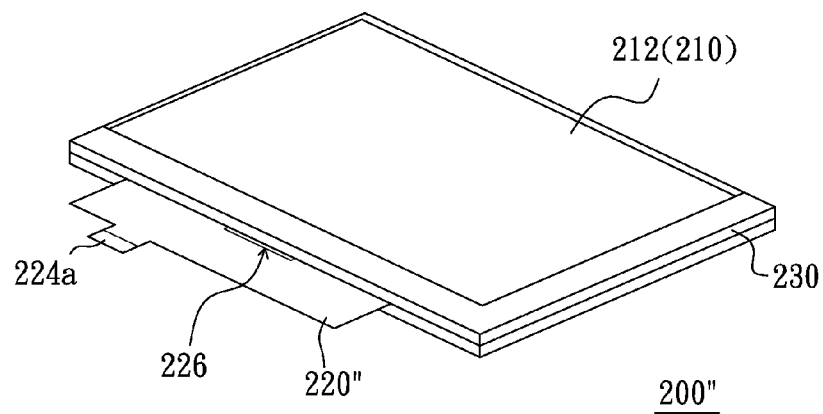
FIG. 5A is a schematic view of a flexible display apparatus according to another embodiment of the present invention.
Figure 5B:
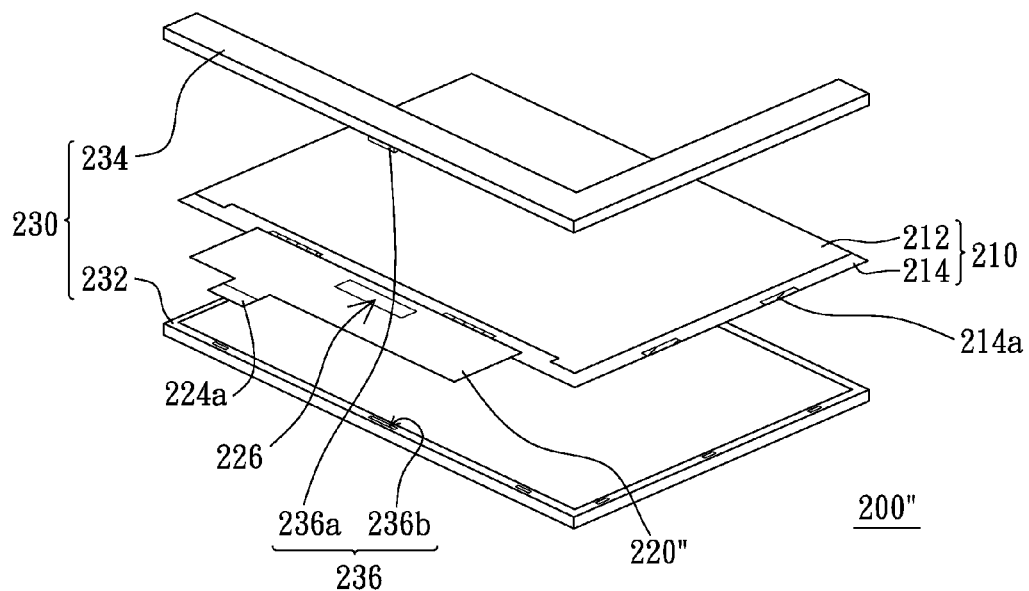
FIG. 5B is an exploded perspective view of FIG. 5A.

FIG. 5A is a schematic view of a flexible display apparatus according to another embodiment of the present invention, and FIG. 5B is an exploded perspective view of FIG. 5A. Referring to FIGS. 5A and 5B, the flexible display apparatus 200" of the present embodiment is similar to the flexible display apparatus 200' of FIGS. 4A and 4B, and the only difference between the flexible display apparatus 200" and the flexible display apparatus 200' is the FPCB. More specifically, the FPCB 220" of the flexible display apparatus 200" does not comprise two portions. In other words, in the flexible display apparatus 200" of the present embodiment, the locating unit 236 of the frame assembly 230 is used to prevent the connection portion between the FPCB 220" and the peripheral circuit 214 of the flexible display panel 210 from being pulled. Therefore, damages (e.g. electrical damage and structure damage) between the FPCB 220" and the peripheral circuit 214 caused by pulling the FPCB 220" and the peripheral circuit 214 can be prevented, and reliability of the flexible display apparatus 200" of the present embodiment can be improved In summary, the present invention can achieve at least the following advantages.

1. In an embodiment of the present invention, because the bending modulus of the first portion of the FPCB is smaller, the first portion can be used to be the stress buffer to prevent damages caused by the pull force between the FPCB and the peripheral circuit, and the reliability of the flexible display apparatus is consequently improved.

2. In another embodiment of the present invention, the FPCB has the locating hole and the frame assembly has the locating unit passing through the locating hole that prevent the FPCB and the flexible display panel from being pulled with each other, and therefore the reliability of the flexible display apparatus is improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A flexible display apparatus, comprising:
    a flexible display panel comprising a display body and a peripheral circuit, and the peripheral circuit being adjacent to the display body;
    a flexible printed circuit board connected to the peripheral circuit, the flexible printed circuit board comprising a first portion and a second portion, the first portion and the second portion being substantially rectangular, the second portion having a connection interface protruding from a rectangular region of the second portion connected to the first portion, the first portion being connected between the peripheral circuit and the second portion, wherein a thickness of the first portion is smaller than that of the second portion to let the first portion be a stress buffer and bending modulus of the first portion is smaller than that of the second portion, such that while the second portion being pulled or flexed, bending strain of the first portion is greater than that of the second portion and the stress buffer reduces the pull force between the flexible printed circuit board and the peripheral circuit; and
    a frame assembly, comprising:
        a first frame for carrying the flexible display panel; and
        a second frame assembled with the first frame to cover the peripheral circuit and expose the display body, wherein the flexible printed circuit board has a locating hole, the frame assembly has a locating unit for passing through the locating hole, the locating unit comprises a fixed pin and a fixed hole, the fixed pin is for passing through the locating hole and fixed in the fixed hole, a size of the locating hole being greater than an outer diameter of the fixed pin, a relative location between the fixed pin and the locating hole being changeable, one of the fixed pin and the fixed hole is disposed at the first frame, and the other one of the fixed pin and the fixed hole is disposed at the second frame.

2. The flexible display apparatus as claimed in claim 1, wherein the thickness of the first portion is between 0.03 mm and 0.1 mm, and the thickness of the second portion is between 0.1 mm and 0.15 mm.

3. The flexible display apparatus as claimed in claim 1, wherein the first portion has two short sides connected between the second portion and the peripheral circuit, and a length of each of the short sides is greater than 5 millimeters.

4. The flexible display apparatus as claimed in claim 1, wherein the locating hole is disposed at the first portion.

5. The flexible display apparatus as claimed in claim 1, wherein the flexible display panel comprises a flexible electrophoretic display panel or a flexible liquid crystal display panel.

6. A flexible printed circuit board adapted for being connected to a peripheral circuit of a display apparatus, the flexible printed circuit board comprising:
    a first portion with substantially rectangular shape; and
    a second portion with substantially rectangular shape, the second portion having a connection interface protruding from a rectangular region of the second portion connected to the first portion, the first portion being adapted for being connected between the peripheral circuit and the second portion, wherein a thickness of the first portion is smaller than that of the second portion to let the first portion be a stress buffer and bending modulus of the first portion is smaller than that of the second portion, such that while the second portion being pulled or flexed, bending strain of the first portion is greater than that of the second portion and the stress buffer could reduce the pull force between the flexible printed circuit board and the peripheral circuit.

\* \* \* \* \*